(12) United States Patent  
Chou et al.

(10) Patent No.: US 9,976,215 B2  
(45) Date of Patent: May 22, 2018

(54) SEMICONDUCTOR FILM FORMATION APPARATUS AND PROCESS

(75) Inventors: You-Hua Chou, Taipei (TW); Chih-Tsung Lee, Hsinchu (TW); Shu-Fen Wu, Yilan (TW); Chin-Hsiang Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 560 days.

(21) Appl. No.: 13/460,884

(22) Filed: May 1, 2012

(65) Prior Publication Data

US 2013/0295297 A1 Nov. 7, 2013

(51) Int. Cl.
  *C23C 16/455* (2006.01)
  *C23C 16/509* (2006.01)

(52) U.S. Cl.
  CPC .... *C23C 16/45565* (2013.01); *C23C 16/5096* (2013.01)

(58) Field of Classification Search
  USPC ......... 118/723 E, 723 R; 156/345.43, 345.44
  See application file for complete search history.

(56) References Cited

U.S. PATENT DOCUMENTS 5,755,886 A * 5/1998 Wang et al. ................. 118/715
5,865,896 A * 2/1999 Nowak et al. ............. 118/723 I
5,958,140 A * 9/1999 Arami et al. ................. 118/725
6,406,545 B2 * 6/2002 Shoda et al. ................. 118/724
6,422,172 B1 * 7/2002 Tanaka et al. ............ 118/723 R
2006/0011298 A1   1/2006 Lim et al.

FOREIGN PATENT DOCUMENTS

| KR | 10-2006-006219 | 1/2006 |
| KR | 10-2009-0026899 | 3/2009 |
| KR | 10-1062453 | 9/2011 |
| WO | 2009089245 | 7/2009 |

OTHER PUBLICATIONS

Official Action dated Jul. 31, 2013, in counterpart Korean Patent Application No. 10-2012-0088686.

* cited by examiner

*Primary Examiner* — Rudy Zervigon
(74) *Attorney, Agent, or Firm* — Duane Morris LLP

(57) ABSTRACT

An apparatus and method are disclosed for forming thin films on a semiconductor substrate. The apparatus in one embodiment includes a process chamber configured for supporting the substrate, a gas excitation power source, and first and second gas distribution showerheads fluidly coupled to a reactive process gas supply containing film precursors. The showerheads dispense the gas into two different zones above the substrate, which is excited to generate an inner plasma field and an outer plasma field over the wafer. The apparatus deposits a material on the substrate in a manner that promotes the formation of a film having a substantially uniform thickness across the substrate. In one embodiment, the substrate is a wafer. Various embodiments include first and second independently controllable power sources connected to the first and second showerheads to vary the power level and plasma intensity in each zone.

17 Claims, 4 Drawing Sheets

SEMICONDUCTOR FILM FORMATION APPARATUS AND PROCESS

FIELD

The present disclosure generally relates to semiconductor processes, and more particularly to an apparatus and process for forming thin films on a semiconductor substrate such as a wafer.

BACKGROUND

Plasma-enhanced chemical vapor deposition (PECVD) is a chemical-based process used to deposit thin semiconductor material films or layers on a substrate such as a wafer in the formation of integrated circuit devices such as chips and dies. PECVD machines or tools generally include a reaction or process chamber configured for holding the wafer. A reactant or process gas containing the desired film material chemical precursors is introduced into the chamber and energized by a power source that generates an RF (radio frequency) (AC) or DC signal sufficient to excite a capacitive discharge and form an ionized gas plasma above the wafer. The reaction grows or deposits a generally conformal thin film on the wafer surface which can include a wide array of film materials such as silicon dioxide (SO2), silicon oxynitride (SiON), polysilicon, silicon nitride (SiN), dielectrics, etc.

The thicknesses of films formed during PECVD are sometimes not uniform and vary across the surface of the wafer. This can be attributed to factors such as the process chamber design, RF electrode arrangement, and gas injection system configuration and pressures, etc. The resultant RF plasma field produced sometimes preferentially favors the central portion of the wafer where the plasma field is often strongest and chemical reaction deposition rates therefore highest. Accordingly, the semiconductor film formed near the edge or peripheral regions of the wafer may be thinner than the central region of the wafer. Non-uniformity in film thickness may compromise subsequent wafer fabrication steps, and adversely affect the integrity and performance of IC devices built on the wafer thereby increasing die reject rates. Moreover, difficulty in maintaining film uniformity across the wafer can be expected to become more problematic as wafer sizes increase from the 300 mm to larger 450 mm sizes that allow more IC devices to be built on a single substrate and offer associated economies.

BRIEF DESCRIPTION OF THE DRAWINGS

The features of the embodiments will be described with reference to the following drawings where like elements are labeled similarly, and in which.

Figure 1:
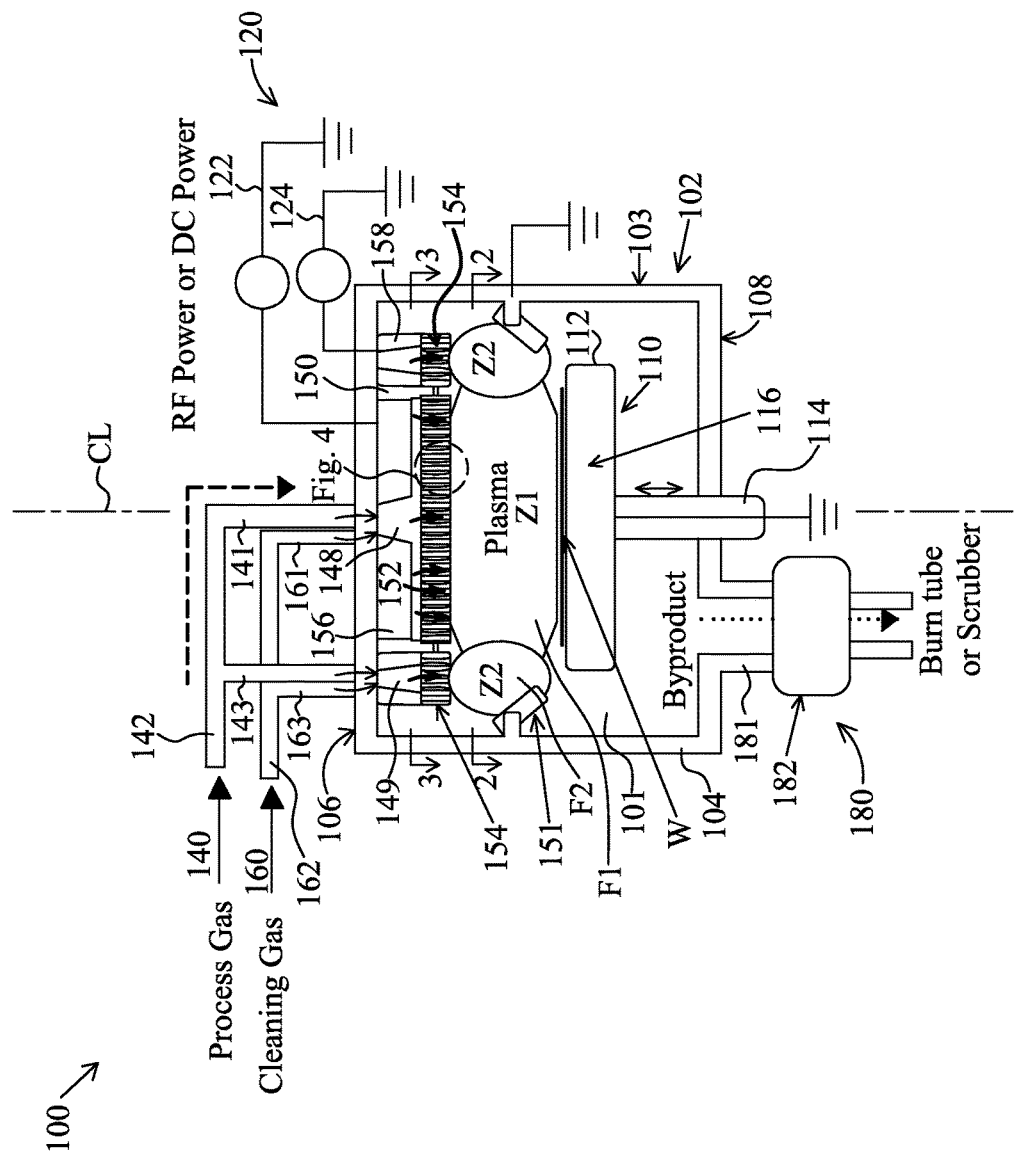
FIG. 1 is a cross-sectional side view of an embodiment of a PECVD apparatus and illustrates representative gas plasma field configurations produced therein.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation.

Terms such as "attached," "affixed," "coupled," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

FIG. 1 depicts one embodiment of a PECVD processing apparatus 100 according to the present disclosure for forming thin films on a semiconductor substrate, which in some embodiments without limitation is a wafer W. PECVD apparatus 100 is configured to produce multiple plasma fields in different zones of the process chamber which are shaped to improve film deposition uniformity over the surface of the wafer, particularly at the outer peripheral or edge portions of the wafer including the next generation 450 mm wafers. In the embodiment shown, as further described below, a two-zone plasma field is created including a first inner field F1 in zone Z1 of process chamber 102 that is associated with the central and interior regions of the wafer, and a second outer peripheral field F2 in zone Z2 that is associated with the outer peripheral or edge regions of the wafer.

It will be appreciated that although the substrate is described for convenience in exemplary embodiments in the present disclosure with respect to a wafer W, the substrate may be any type, configuration, or size of semiconductor substrate that is amenable to processing in a PECVD chamber. Accordingly, the present disclosure is not limited to substrates in the form of a semiconductor wafer alone.

Referring again to FIG. 1, in one embodiment PECVD apparatus 100 includes a reaction or process chamber 102 having an outer shell 104 that includes a lid or top 106, bottom 108, and sidewalls 103, a gas excitation power supply or system 120 for producing ionized gas plasma, a process gas supply system 140 including at least two gas distribution showerheads 152, 154, a cleaning gas supply system 160, and a gas removal system 180. In some embodiments, top 106 is removable to allow loading of a wafer into the chamber 102.

Process chamber 102 defines an internal cavity 101 configured and dimensioned for holding a wafer W. In some embodiments, process chamber 102 and shell 104 are generally cylindrical in configuration with circumferentially-extending sidewalls 103, and circular shaped top 106 and bottom 108. The shell sidewalls 103, top 106, and bottom 108 may be formed of tubes and/or plates comprised of any material suitable for and compatible with a PECVD process chamber environment. In some exemplary embodiments, without limitation, aluminum or an alloy thereof is used.

Figure 2:
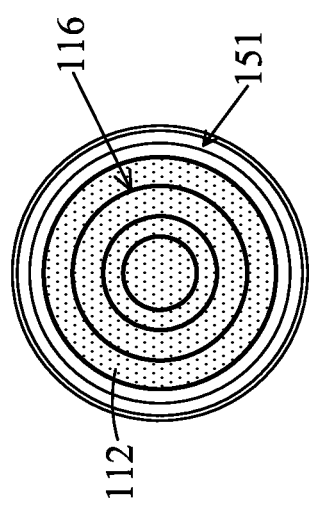
FIG. 2 is a cross-sectional top view of the process chamber in FIG. 1 taken along lines 2-2 in FIG. 1 and showing a wafer support and ground electrodes in further detail.

A wafer support 110 is disposed in process chamber 102 and positioned centrally in cavity 101. Wafer support 110 is configured and dimensioned for supporting wafer W, and defines a vertical axial centerline CL for the support and process chamber 102 (see FIG. 1). In one embodiment, wafer support 110 is in the form of a pedestal including a substantially flat platter 112 configured for supporting wafer W and a vertically-oriented stem or shaft 114 in turn supporting the platter (i.e. wafer support 110 collectively refers to platter 112 and shaft 114). Platter 112 is disc-shaped or circular/round when viewed from the top in an embodiment to complement the shape of wafer W. Platter 112 may be made of any suitable material, including metals such as aluminum. Wafer support 110 is heated in one embodiment to enhance the film formation by mounting electric resistance heater elements or coils 116 embedded within or on a surface of platter 112 as best shown in FIG. 2. Any suitable configuration of coils 116 may be provided. The coils 116 are electrically coupled to an appropriate electric power supply (not shown) which is controllable to regulate the temperature of the wafer W. In some embodiments, the wafer may be heated to between about 150-460 degrees C.

In some embodiments, lower end of shaft 114 is coupled to a motor drive unit (not shown) which is configured and operable to raise/lower the wafer within process chamber 102. This facilitates positioning of the wafer with respect to showerheads 152, 154 to ensure a proper gap is formed for film deposition.

With continuing reference to FIG. 1, process gas supply system 140 includes a process gas supply conduit 142 connected a suitable gas source. The process gas contains chemical precursors preselected for forming the desired type of semiconductor thin film on wafer W. Supply conduit 142 is bifurcated in one embodiment as shown into at least a first branch 141 and second branch 143 for supplying process gas to two separate groups of process gas injection nozzles 144 and 145, respectively. Nozzles 144 may be considered inner gas injection nozzles and nozzles 145 may be considered outer gas injection nozzles. The inner and outer gas injection nozzles 144, 145 are each associated with producing a corresponding plasma fields F1 and F2 in zones Z1 and Z2 respectively of process chamber 102, as further described herein.

Figure 3:
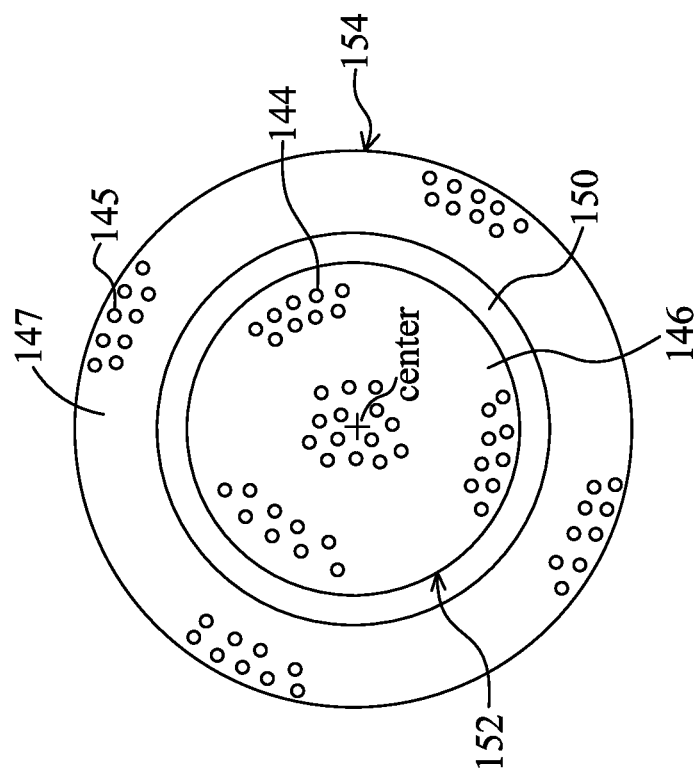
FIG. 3 is a cross-sectional top view of the process chamber in FIG. 1 taken along lines 3-3 in FIG. 1 and showing a gas distribution showerhead in further detail.
Figure 4:
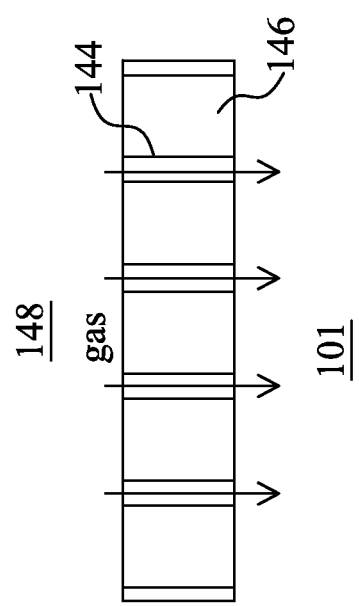
FIG. 4 is a close-up detailed cross-sectional side view of a portion of the gas distribution showerhead of FIG. 1.

FIG. 3 is a top cross-sectional view taken along line 3-3 in FIG. 1 showing a top view of the process gas injection nozzles 144, 145 and arrangement of other components in the top portion of process chamber 102 below the top 106 of the outer shell 104. FIG. 4 is a close-up detailed side elevation view of a portion of the gas injection nozzles 144 taken from FIG. 1.

Referring now to FIGS. 1 and 3-4, the reaction chamber 102 defines a first process gas inlet plenum 148 and second process gas inlet plenum 149 defined in the space generally bounded between top 106 of outer process chamber shell 104 and inner gas injection nozzles 144 and outer gas injection nozzles 145, respectively. First branch 141 and second branch 143 of the process gas supply conduit 140 fluidly communicate with the first and second plenums, respectively. More than one branch 141, 143 may be used to supply process gas to plenums 148, 149 in some embodiments to provide more uniform pressure within each plenum and resulting gas injection flow rates into process chamber 102.

In one embodiment, the inner and outer process gas inlet plenums 148 and 149 are separated by a baffle such as an annular-shaped baffle ring 150 which is supported by the top 103 of the process chamber 102 (shown in cross-section in FIG. 1). Baffle ring 150 fluidly divides and isolates the process gas supply to process chamber 102 and prevents fluid communication between the plenums and inlet to their associated gas injection nozzles 144 and 145. In some embodiments, baffle ring 150 is further made of an electrically insulating material such as without limitation a ceramic (e.g. aluminum oxide or alumina), SiC (silicon carbide), or others, and conductively isolates gas distribution inner showerhead 152 from outer showerhead 154 as shown to allow at least two plasma fields F1, F2 in zones Z1, Z2 of process chamber 102 to be independently generated as further describe herein.

In some embodiments, inner and outer showerheads 152, 154 are attached to and supported at least in part by baffle ring 150 as shown in FIG. 1 and/or conductive blocks 156 and 158? Accordingly, baffle ring 150 has sufficient structural strength to support showerheads 152, 154 in such embodiments.

In one embodiment, with continuing reference to FIGS. 1 and 3-4, an inner gas showerhead 152 comprised of inner nozzle plate 146 defines a plurality of inner gas injection nozzles 144. In one embodiment, nozzles 144 are formed as multiple perforations or orifices extending vertically completely through the nozzle plate. Showerhead 152 and associated nozzle plate 146 may be disc or circular shaped in one embodiment as shown when viewed from the top as in FIG. 4 to complement the shape of the wafer W (or other semiconductor substrate) being processed. In other embodiments not shown, showerhead 152 may be rectilinear shaped. Any suitable number and arrangement of nozzles 144 may be formed in plate 146 depending on the distribution and flow rate of process gas desired for the inner central regions of the process chamber 102.

An outer gas showerhead 154 comprised of outer nozzle plate 147 defines a plurality of outer gas injection nozzles 145 which in one embodiment are formed as multiple perforations or orifices extending vertically completely through the nozzle plate. In one embodiment, showerhead 152 and associated nozzle plate 147 may be annular or ring-shaped in one embodiment, and may be alternatively be referred to as a gas ring. Gs ring or showerhead 152 is concentrically aligned with axial centerline CL of process chamber 102 and a central axis defined by inner plate 146 when viewed from the top as in FIG. 4. Any suitable number and arrangement of nozzles 145 may be formed in plate 146 depending on the distribution and flow rate of process gas desired for the outer peripheral regions of the process chamber 102.

Showerheads 152, 154 including nozzle plates 146, 147 may be made of any suitable metallic materials suitable for a PECVD process chamber. In some embodiments, the nozzle plates 146, 147 will serve as a top electrode for producing the gas plasma when excited by an RF source. Accordingly, the material selected for such an application should be selected accordingly based on the foregoing design considerations. In various embodiments, without limitation, nozzle plates 146, 147 may be made from aluminum, stainless steel, nickel, or other electrical or RF conductive materials capable of withstanding corrosive effects of the gas plasma. In embodiment, the nozzle plates are aluminum or an alloy thereof.

To remove the spent process gas and any volatile waste by-products entrained therein from the PECVD process chamber, an exhaust system provided by gas removal system 180 may include a pump 182 having a flow conduit 181 that is fluidly coupled upstream to the process chamber 102 (see FIG. 1). Pump 182, in some embodiments, forms a vacuum in cavity 101 within process chamber 102 which serves to not only remove the spent or used process gas, but also further assists to draw process gas into the chamber through the gas injection nozzles 144, 145 from process gas line 140. The discharge from pump 182 may be connected to a downstream burner tube and/or scrubber apparatus for burning volatile by-products and removing other compounds from the waste gas stream.

In some embodiments, pump 182 is operable to produce operating pressures in chamber 102 process from about 1,000 Torr to less than 100 Torr levels.

Cleaning gas supply system 160 utilizes the same inlet gas plenums 148, 149 and showerheads (i.e. nozzle plates 146, 147 with gas injection nozzles 144, 145) as the process gas in some embodiments, as already described above. The cleaning gas supply system includes a gas supply conduit 162 connected a suitable cleaning gas source. Gas supply conduit 162 is bifurcated into at last two branches 161 and 163 to supply cleaning gas to each of the inlet gas plenums 148, 149 in a manner similar to that described herein for process gas system 140. After the wafer W is removed from the PECVD apparatus 100, the cleaning gas is used after each PECVD cycle to remove residual material and by-product deposits that form on the sidewalls, top, bottom, wafer support, and other components within cavity 101 of process chamber 102 during the PECVD process. Fluorine-based cleaning gases (e.g. NF3, etc.) are commonly used and energized by the power system 120 to form fluoride radicals which are effective to clean the interior process chamber surfaces within cavity 101.

Referring to FIGS. 1 and 2, gas excitation power system 120 will now be further described. The power system 120 includes at least one power source 122, 124 that is conductively coupled to the process chamber 102 and configured to supply a voltage and power signal sufficient to excite a capacitive discharge and form an ionized gas plasma in the process chamber 102 above the wafer for film deposition. In some embodiments, the power source is radio frequency (RF) or DC power. In one embodiment, the power source is RF. If a single power source 122 or 124 is provided, this same power source is conductively coupled to both gas distribution showerheads 152 and 154 in some embodiments wherein the same voltage is applied to each showerhead.

In one embodiment according to the present disclosure, the power system 120 includes two separate and independently controllable power sources 122 and 124 are provided for a two-zone gas plasma field PECVD apparatus 100. This provides a discrete independently controllable power source for each zone Z1 and Z2 of process chamber 102 for generating plasma fields F1 and F2, as further described herein. Power sources 122, 124 are each independently controllable via a dedicated suitably configured power controller configured to adjust the power output to showerheads 152, 154 and thereby alter the intensity of their respective plasma fields produced. This in turn allows control of the chemical reaction and semiconductor film thicknesses formed on different portions of the wafer which are associated with the position of each plasma field F1, F2. Those skilled in the art can readily determine and provide suitably configured power sources and power controllers.

In various embodiments, for example without limitation, the power controllers are operable to generate and regulate RF power from power sources 122, 124 in a range from about 1-1,000 KW and a standard frequency of about 13.56 MHz. In some embodiments, the power controllers are operable in essence to adjust the power source impedance for RF impedance matching as will be well known to those skilled in the art to maximize power transfer. RF power works with RF matching to deliver RF (Radio Frequency) into the process system. Since RF passes through the metal or cable metal surfaces in the system, the impedance from the metal or process chamber system needs to be conquered by RF match, which compensates for the reflection power as RF power is delivered into the process system.

With continuing reference to FIGS. 1 and 2, gas ionization in each gas plasma field F1 and F2 is generated by applying a voltage to the process gas between two electrodes; one electrode being a top power supply electrode and the other electrode being a bottom ground electrode. In one embodiment, the metallic inner and outer showerheads 152, 154 are electrically coupled to power sources 122 and 124 respectively and serve as the power supply or top electrodes for each zone Z1 and Z2 of process chamber 102. The showerheads 152, 154 may be conductively connected directly to power sources 122, 124, or alternatively indirectly connected via one or more conductive blocks 156 and 158 as shown in FIG. 1. Conductive block 156 electrically couples inner showerhead 152 to power source 122. Similarly, conductive block 158 electrically couples outer showerhead 154 to power source 124. In some embodiments, the conductive blocks 156, 158 can further serve as supports for the showerheads 152, 154, as shown in FIG. 1 wherein two conductive blocks 158 support outer showerhead 154.

Plasma field F1 produced in zone Z1 of process chamber 102 is a centrally located inner plasma field that occupies a central interior region over wafer W in the process chamber 102. Plasma field F1 is generated between inner showerhead 152 acting as the top electrode and metallic platter 112 of wafer support 110 which is electrically grounded as shown in FIG. 1 to act as a bottom electrode (the first bottom electrode). Process gas flowing from gas injection nozzles 144 between the energized showerhead 152 and platter 112 is ionized to form the plasma field F1 in chamber zone Z1. Plasma field F1 is concentrically aligned with a vertical central axis of the wafer W and platter 112 of wafer support 110.

In one embodiment, plasma field F1 has a generally circular configuration when viewed from the top corresponding to the shape of showerhead 152 (see FIG. 3) acting as the top electrode, and in side elevation view (see FIG. 1) has an generally elliptical or oval configuration that begins to narrow inwardly (top and bottom) towards the edge or peripheral regions of the wafer. The vertical narrowing of plasma field F1 correlates to a reduction in plasma field intensity towards the edges or perimeter of the plasma field.

Plasma field F2 produced in zone Z2 of process chamber 102 is a peripherally located outer plasma field that occupies a peripheral exterior region over wafer W in the process chamber 102. Plasma field F2 is formed proximate to and supplements plasma field F1 to provide a separately controllable plasma field that specifically targets film deposition in the peripheral or edge regions of the wafer W. Plasma field F2 is generated between outer showerhead 154 acting as the top electrode and a conductive metallic side plate ground electrode 151 which is electrically grounded as shown in FIG. 1 to act as a bottom electrode (the second bottom electrode). In one embodiment, side plate ground electrode 151 has an annular or ring-shaped configuration with an open center as shown in FIGS. 1 and 2. Process gas flowing from gas injection nozzles 145 between the energized showerhead 154 and side plate ground electrode 151 is ionized to form the plasma field F2 in chamber zone Z2. Plasma field F2 is concentrically aligned with a vertical central axis of the wafer W and platter 112 of wafer support 110, and plasma field F1 enveloped inside field F2.

In one embodiment, plasma field F2 has a generally annular or ring shaped configuration when viewed from the top corresponding to the shape of showerhead 154 as shown in FIG. 3 acting as the top electrode and annular shaped side plate ground electrode 151 as shown in FIG. 2. Plasma field F2 therefore surrounds and extends circumferentially around plasma field F1 in proximate relationship thereto, thereby having a configuration that complements the inner plasma field F1. Accordingly, plasma field F2 may be considered to be "donut-shaped" in some embodiments and does not cover or extend over the central region of the wafer proximate to centerline CL of the process chamber 102.

Side plate ground electrode 151 may be made of any electrically conductive metal suitable for a ground electrode and withstanding the process conditions within process chamber 102. In some embodiments, side plate electrode 151 may be made from metals similar to showerheads 152, 154 as already described herein including without limitation aluminum, stainless steel, nickel, or other electrically conductive materials. Side plate electrode 151 is physically separated from platter 112 of wafer support 110 as shown in FIGS. 1 and 2 and connected separately to ground.

In one embodiment, as shown in FIG. 1, side plate electrode 151 when configured as a ground ring may include at least one tilted or angled surface that faces upwards and inwards toward the axial centerline CL of process chamber 102 with respect to the horizontal plane defined by the platter 112 of the wafer support 110 (best shown in the cross section of FIG. 1). The side plate electrode 151 is positioned above grounded platter 112 and proximate to the peripheral edges of the platter as further shown in FIG. 2.

It will be appreciated that the operating power levels selected for power sources 122 and 124 will be based on the size of the wafer being processed, type of film material being deposited, and other operating parameters and factors as will be well understood by those skilled in the art. Advantageously, since plasma fields F1 and F2 are independently adjustable via their respective power source controllers as described herein, the operator can fine tune and balance the semiconductor film formation rates for the interior and peripheral regions of the wafer to achieve a relatively uniform film thicknesses over the entire surface of the wafer (allowing for acceptable variance which do not adversely affect IC device integrity or performance).

An exemplary method for forming thin semiconductor films on a substrate such as wafer W in a PECVD apparatus will now be briefly described. The PECVD apparatus 100 of FIG. 1 is initially provided and readied for processing. Referring to FIG. 1, the wafer W is first loaded into and positioned in process chamber 102. Wafer W is positioned centrally on platter 112 of wafer support 110 so that the geometric center of the wafer is axially aligned with the centerline CL of the process chamber. Wafer W is spaced apart from and beneath inner showerhead 152. In one embodiment, showerhead 152 has a diameter that is approximately the same as the diameter of the wafer being processed. In some embodiments, the wafer diameter is 450 mm. The gap between showerhead 152 and wafer W may be preselected depending on the type of film material being deposited, the process gas flow rate, power source level, and other factors. The gap may be adjusted by raising or lower platter 112 with the wafer support 114 drive motor.

With continuing reference to FIG. 1, the semiconductor film formation process continues by supplying the reactive process gas containing the film precursor material constituents to process chamber 102 through showerheads 152 and 154. This gas flows from supply conduit 142 through branches 141, 143 and into plenums 148, 149, respectively. From plenum 148, the process gas enters process chamber 102 through gas injection nozzles 144 in nozzle plate 146. From plenum 149, the process gas enters the process chamber through gas injection nozzles 145 in nozzle plate 147. This produces two separate gas flow paths into the process chamber.

The semiconductor film formation process continues by exciting the reactive process gas through actuating a first power source 122 associated and conductively coupled with inner showerhead 152. Power source 122 is actuated at a predetermined RF level and energizes showerhead 152 to generate a capacitive discharge. In one embodiment, the power source is RF. The showerhead 152 may be energized before or during initiation of process gas flow into process chamber 102 in various embodiments to ensure that the gas is sufficiently ionized to begin the film deposition process. Energizing the process gas forms a first plasma field F1 in the process chamber 102 occupying zone Z1 (see FIG. 1).

With reference to FIG. 1, according to the present disclosure, the process further includes exciting the reactive gas in process chamber 102 through actuating a second power source 124 associated and conductively coupled with outer gas ring or showerhead 154. Power source 124 is actuated at a predetermined RF level and energizes showerhead 154 to generate a capacitive discharge. In one embodiment, the power source is RF. Energizing the process gas with the second power source 124 forms a second plasma field F2 in the process chamber 102 occupying zone Z2 (see FIG. 1). The first plasma field F1 is disposed inside and enveloped by the second plasma field F2.

The first and second plasma fields operably deposit a semiconductor material film on the wafer of a type corresponding to the film precursor constituents present in the reactive gas. Advantageously, dispensing and exciting two separate reactive gas streams from the first and second showerheads 152, 154 deposits a substantially material film of substantially uniform thickness on the surface of the wafer.

Figure 5:
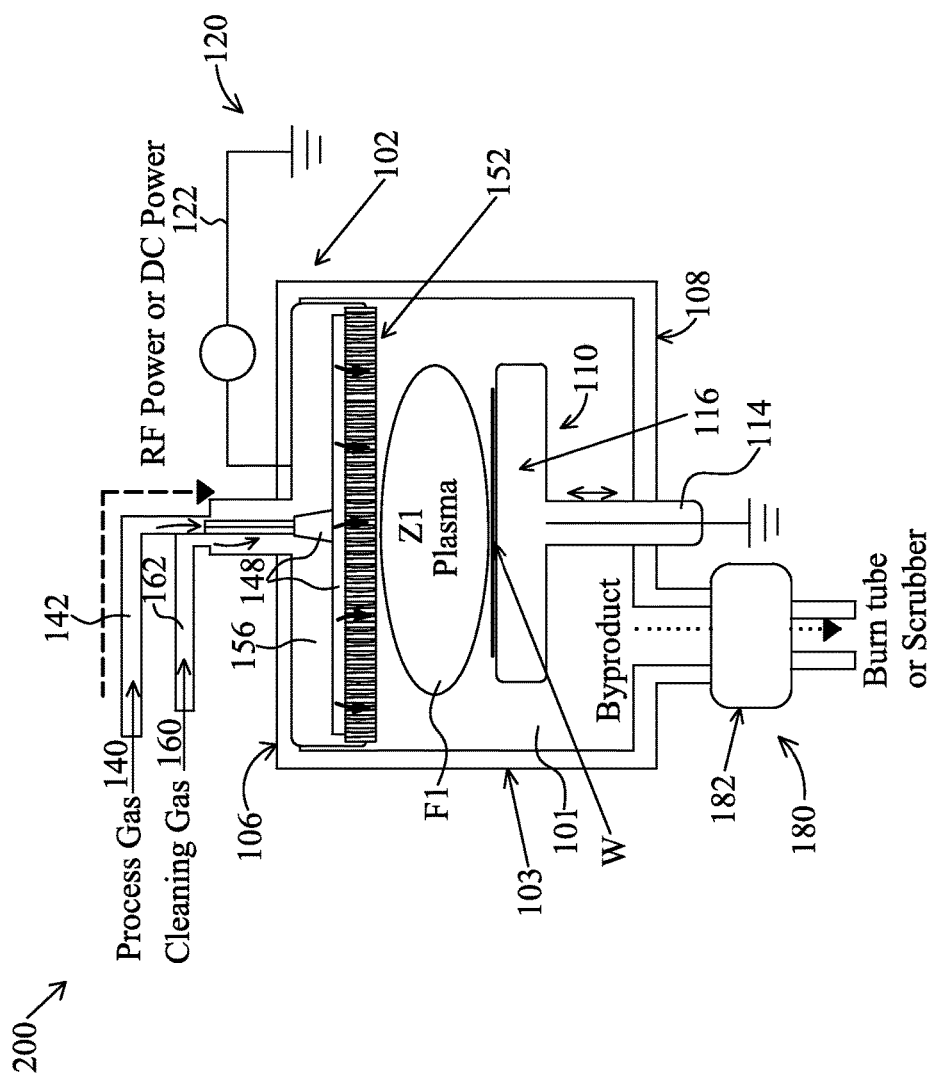
FIG. 5 is a cross-sectional side view of another embodiment of a PECVD apparatus and illustrates a representative plasma field configuration produced therein.

FIG. 5 is a cross-sectional side view of another embodiment of a PECVD apparatus 200 and illustrates a representative plasma field configuration produced in processing chamber 102. The apparatus 200 is generally configured similarly to apparatus 100 already described herein, with exception that only a single process gas supply, gas distribution showerhead and associated inlet plenum, and power source are provided. The apparatus 200 shown generates one gas plasma field in a single zone between the energized showerhead 152 (top electrode) and the grounded platter of substrate support 110 (bottom electrode). In contrast to the PECVD apparatus of FIG. 1, no secondary plasma field is generated in this embodiment around the periphery of wafer W to help compensate for larger diameter wafer processing and film formation that enhances film thickness uniformity across the surface of the wafer.

According to one aspect of the present disclosure, an apparatus for forming thin films on a semiconductor substrate includes a process chamber configured for supporting the substrate, a first gas distribution showerhead disposed in the chamber, the first showerhead being fluidly coupled to a process gas supply system and operable to dispense the process gas into the chamber in a first zone above the substrate, a second gas distribution showerhead disposed in the chamber, the second showerhead being fluidly coupled to the process gas supply system and operable to dispense the process gas into the chamber in a second zone above the substrate, the second zone being different than the first zone, and a gas excitation power system conductively coupled to the process chamber. The power system is operable to excite the process gas and generate a gas plasma inside the process chamber for forming a material film on the substrate. In one embodiment, the second showerhead is annular or ring-shaped and the first showerhead is disposed inside the second showerhead. The first showerhead is circular or disc shaped in one embodiment and conforms to an interior space defined by the annular shaped second showerhead. In one embodiment the apparatus is a PECVD machine or tool. The substrate is a wafer in some embodiments.

According to another aspect of the present disclosure, a PECVD apparatus for forming thin films on a semiconductor substrate includes a process chamber, a substrate support disposed inside the chamber and being configured for supporting the substrate, the substrate supported being electrically grounded, a first gas distribution showerhead disposed in the chamber, the first showerhead being fluidly coupled to a process gas supply system and operable to dispense the process gas into the chamber in a first zone above the substrate, a second gas distribution showerhead disposed in the chamber and having a ring-shaped configuration, the first showerhead being disposed inside the second showerhead, the second showerhead being fluidly coupled to the process gas supply system and operable to dispense the process gas into the chamber in a second zone above the substrate, a side plate ground electrode disposed in the chamber and being electrically grounded, and a gas excitation power system conductively coupled to the process chamber. The power system is operable to excite the process gas and generate a gas plasma inside the process chamber for forming a material film on the substrate. In one embodiment, the power system includes a first power source operable to energize the first showerhead and a second power source operable to energize the second showerhead, wherein the gas plasma includes a first plasma field generated between the first showerhead and substrate support and a second plasma field generated between the second showerhead and the side plate ground electrode. The substrate is a wafer in some embodiments.

According to another aspect of the present disclosure, a method for forming thin films on a semiconductor substrate includes: positioning the substrate in a process chamber; supplying a reactive process gas into the process chamber for forming a material film on the wafer; exciting the process gas with a first power source; forming a first plasma field in the process chamber; exciting the gas with a second power source; forming a second plasma field in the process chamber; and depositing a semiconductor material film on the wafer. In one embodiment, the step of supplying a reactive process gas into the process chamber further includes dispensing the process gas through a first inner gas distribution showerhead, and dispensing the process gas through a second outer annular-shaped gas distribution showerhead. The first showerhead is disposed inside the second showerhead in this embodiment.

While the foregoing description and drawings represent exemplary embodiments of the present disclosure, it will be understood that various additions, modifications and substitutions may be made therein without departing from the spirit and scope and range of equivalents of the accompanying claims. In particular, it will be clear to those skilled in the art that various embodiments according to the present disclosure may be configured in other forms, structures, arrangements, proportions, sizes, and with other elements, materials, and components, without departing from the spirit or essential characteristics thereof. In addition, numerous variations in the exemplary methods and processes described herein may be made without departing from the present disclosure. The presently disclosed embodiments are therefore to be considered in all respects as illustrative and not restrictive, the scope of the claimed invention being defined by the appended claims and equivalents thereof, and not limited to the foregoing description or embodiments.

What is claimed is:

1. An apparatus comprising:
a process chamber having a substrate support configured for supporting a substrate;
at least two gas distribution showerheads comprising a first and a second gas distribution showerheads disposed in the chamber, the first gas distribution showerhead being fluidly coupled to a process gas supply system and operable to dispense the process gas into the chamber in a first zone above the substrate, the second gas distribution showerhead being fluidly coupled to the process gas supply system and operable to dispense the process gas into the chamber in a second zone above the substrate, the second zone being different than the first zone, wherein each of the first and second gas distribution showerheads includes at least two pluralities of gas injection nozzles extending through a nozzle plate in each gas distribution showerhead, the first gas distribution showerhead comprises a first plurality of gas injection nozzles with a first radius and a second plurality of gas injection nozzles with a second radius, the first and the second radii are different from each other, the second gas distribution showerhead comprises a third plurality of gas injection nozzles with a third radius and a fourth plurality of gas injection nozzles with a fourth radius, the third and the fourth radii are different from each other, each of the first and the second radii is smaller than each of the third and the fourth radii, each of the first, the second, the third and the fourth radii is a position with respect to the center of the respective gas distribution showerhead locating a respective plurality of gas injection nozzles, and is greater than zero; and
a gas excitation power system conductively coupled to the process chamber, the power system being operable to excite the process gas and generate at least two plasma fields above the substrate comprising a first plasma field in the first zone and a second plasma field in the second zone, wherein the power system includes a first power source conductively coupled to the first gas distribution showerhead and a second power source conductively coupled to the second gas distribution showerhead,
wherein the first and second power sources being independently controllable and capable of generating RF and DC power from each power source.

2. The apparatus of claim 1, wherein the second gas distribution showerhead is annular-shaped and the first gas distribution showerhead is disposed inside the second gas distribution showerhead.

3. The apparatus of claim 2, wherein the first gas distribution showerhead is circular or disc shaped.

4. The apparatus of claim 1, wherein the first gas distribution showerhead is fluidly connected to a first gas inlet plenum and the second gas distribution showerhead is fluidly connected to a second gas inlet plenum, the first and second plenums being fluidly isolated from each other and coupled separately to the process gas supply system.

5. The apparatus of claim 4, further comprising a baffle ring attached to a top of the process chamber, the baffle ring fluidly separating the first and second gas inlet plenum.

6. The apparatus of claim 4, wherein the second gas inlet plenum is annular shaped.

7. The apparatus of claim 1, wherein the power system is a radio frequency (RF) power source.

8. The apparatus of claim 1, wherein the first plasma field is generated between the first gas distribution showerhead and a first bottom electrode, and the second plasma field is generated between the second gas distribution showerhead and a second bottom electrode, the first and second gas plasma fields having different configurations.

9. The apparatus of claim 8, wherein the second bottom electrode is ring shaped and extends circumferentially around the first bottom electrode.

10. The apparatus of claim 9, wherein the first bottom electrode is disc shaped and configured for supporting the substrate in the process chamber at a position below at least one of the first or second gas distribution showerheads.

11. A PECVD apparatus for forming thin films on a substrate comprising:
a process chamber;
a substrate support disposed inside the chamber and being configured for supporting the substrate, the substrate supported being electrically grounded;
a first gas distribution showerhead disposed in the chamber, the first gas distribution showerhead being fluidly coupled to a process gas supply system and operable to dispense the process gas into the chamber in a first zone above the substrate;
a second gas distribution showerhead disposed in the chamber and having a ring-shaped configuration, the first gas distribution showerhead being disposed inside the second gas distribution showerhead, the second gas distribution showerhead being fluidly coupled to the process gas supply system and operable to dispense the process gas into the chamber in a second zone above the substrate;
a side plate ground electrode disposed in the chamber and being electrically grounded; and
a gas excitation power system conductively coupled to the process chamber, the power system being operable to excite the process gas and generate a gas plasma inside the process chamber for forming a material film on the substrate, wherein the power system includes a first power source operable to energize the first gas distribution showerhead and a second power source operable to energize the second gas distribution showerhead,
wherein each of the first and second gas distribution showerheads includes at least two gas injection nozzles extending through a nozzle plate in each gas distribution showerhead, the first gas distribution showerhead comprises a first plurality of gas injection nozzles with a first radius and a second plurality of gas injection nozzles with a second radius, the first and the second radii are different from each other, the second gas distribution showerhead comprises a third plurality of gas injection nozzles with a third radius and a fourth plurality of gas injection nozzles with a fourth radius, the third and the fourth radii are different from each other, each of the first and the second radii is smaller than each of the third and the fourth radii, each of the first, the second, the third and the fourth radii is a position with respect to the center of the respective gas distribution showerhead locating a respective plurality of gas injection nozzles, and is greater than zero,
wherein the power system is a DC power source.

12. The apparatus of claim 11, wherein the gas plasma includes a first plasma field generated between the first gas distribution showerhead and substrate support and a second plasma field generated between the second gas distribution showerhead and the side plate ground electrode.

13. The apparatus of claim 11, wherein the side plate ground electrode is above and proximate to a peripheral edge of a platter on the substrate support.

14. The apparatus of claim 1, wherein the power system is a DC power source.

15. The apparatus of claim 1, wherein each of the first and second gas distribution showerheads includes more than two gas injection nozzles extending through a nozzle plate in each gas distribution showerhead.

16. The apparatus of claim 1, wherein each of the first, the second, the third and the fourth of gas distribution showerheads comprises more than two gas injection nozzles.

17. The apparatus of claim 1, wherein each of the first, the second, the third and the fourth of gas distribution showerheads comprises more than four gas injection nozzles.

* * * * *